United States Patent [19]
Hijiya et al.

[11] Patent Number: 5,101,249
[45] Date of Patent: Mar. 31, 1992

[54] NONVOLATILE SEMICONDUCTOR MEMORY DEVICE

[75] Inventors: Shinpei Hijiya, Sagamihara; Takao Nozaki, Yokohama; Takashi Ito, Kawasaki; Hajime Ishikawa, Yokohama, all of Japan

[73] Assignee: Fujitsu Limited, Kawasaki, Japan

[21] Appl. No.: 859,237

[22] Filed: May 6, 1986

Related U.S. Application Data

[63] Continuation of Ser. No. 541,107, Oct. 12, 1983, which is a continuation of Ser. No. 182,672, Aug. 29, 1980, abandoned.

[30] Foreign Application Priority Data

Aug. 31, 1979 [JP] Japan .................. 54-111164

[51] Int. Cl.⁵ ............... H01L 29/78; H01L 29/34; G11C 11/40
[52] U.S. Cl. .................... 357/23.5; 357/54; 365/185
[58] Field of Search ............. 357/23.5, 41, 54; 365/184, 185

[56] References Cited

U.S. PATENT DOCUMENTS

| | | | |
|---|---|---|---|
| 3,660,819 | 5/1972 | Frohman-Bentchkowsky | 357/23.5 |
| 3,856,587 | 12/1974 | Yamazaki et al. | 357/23 VT |
| 3,878,549 | 4/1975 | Yamazaki et al. | 357/23 VT |
| 3,984,822 | 10/1976 | Simko et al. | 357/23.5 |
| 4,104,675 | 8/1978 | Dimaria et al. | |
| 4,257,832 | 3/1981 | Schwabe et al. | 357/23 VT |

OTHER PUBLICATIONS

Ito et al., "Very Thin Silicon Nitride Films . . . " J. Electrochemical Society, vol. 125 (3/78) pp. 448-452.
Franz et al., "Conversion of Silicon Nitride into Silicon Oxide . . . " Solid-State Electronics, vol. 14 (1971) pp. 499-505.
Falgon et al., "Oxidized Silicon Nitride Films in Thin Insulator MIS Structures" IEEE Int. Electron Devices Meeting (12/84) pp. 161-164.
Andrews et al., "High-Field Dark Currents in Thin CVD Silicon Nitride with Graded Interfacial Composition" Appl. Physics Lett., vol. 34 (1 Jun. 79) pp. 785-787.
International Electron Devices Meeting, Technical Digest, "10V Write/Erase, Earom Cells with Directly Nitrided Silicon Nitride Films as First Insulting Layers", by Ito et al., Dec. 5th-7th 1977, pp. 284-286.
IEEE Transactions on Electron Devices, "Auger Depth Profiling of Mnos Structures by Ion Sputtering", by Johannessen et al., vol. Ed-24, No. 5, May 1977, pp. 547-551.
Proceedings of the IEEE, "Nonvolatile Semiconductor Memory Devices", by Chang, vol. 64, No. 7, Jul. 1976, pp. 1039-1059.
Journal of Applied Physics, "Graded or Stepped Energy Band-Gap-Insulator MIS Structures (G1-MIS or SI-MIS)", by Dimaria, vol. 50, No. 9, 9/1979, pp. 5826-5829.
Raider et al., "Surface Oxidation of Silicon Nitride Films", J. Electrochemical Society, vol. 123 (4/76) pp. 560-565.

*Primary Examiner*—Gene M. Munson
*Attorney, Agent, or Firm*—Staas & Halsey

[57] ABSTRACT

A nonvolatile semiconductor memory device comprising: a substrate, a pair of source and drain regions; a channel region between the source and drain regions; a pair of first and second insulating layers on the channel region, and a floating-gate or traps between the first and second insulating layer. The band gap of the first insulating layer increases gradually from the substrate to the floating gate or the traps.

13 Claims, 11 Drawing Sheets

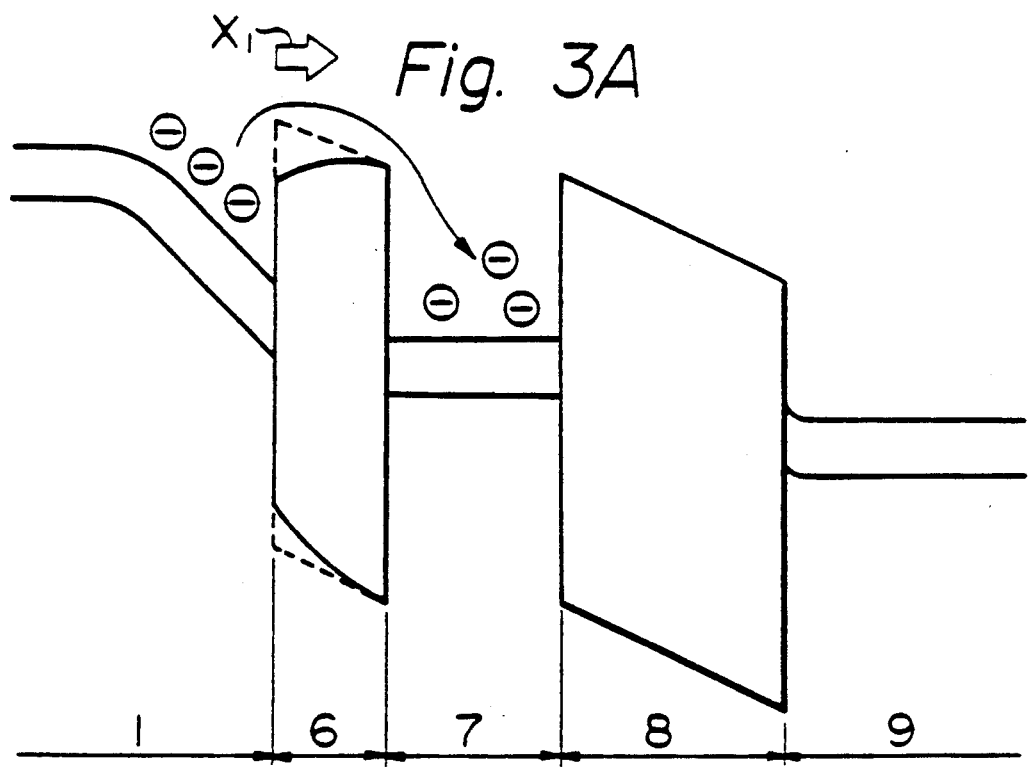
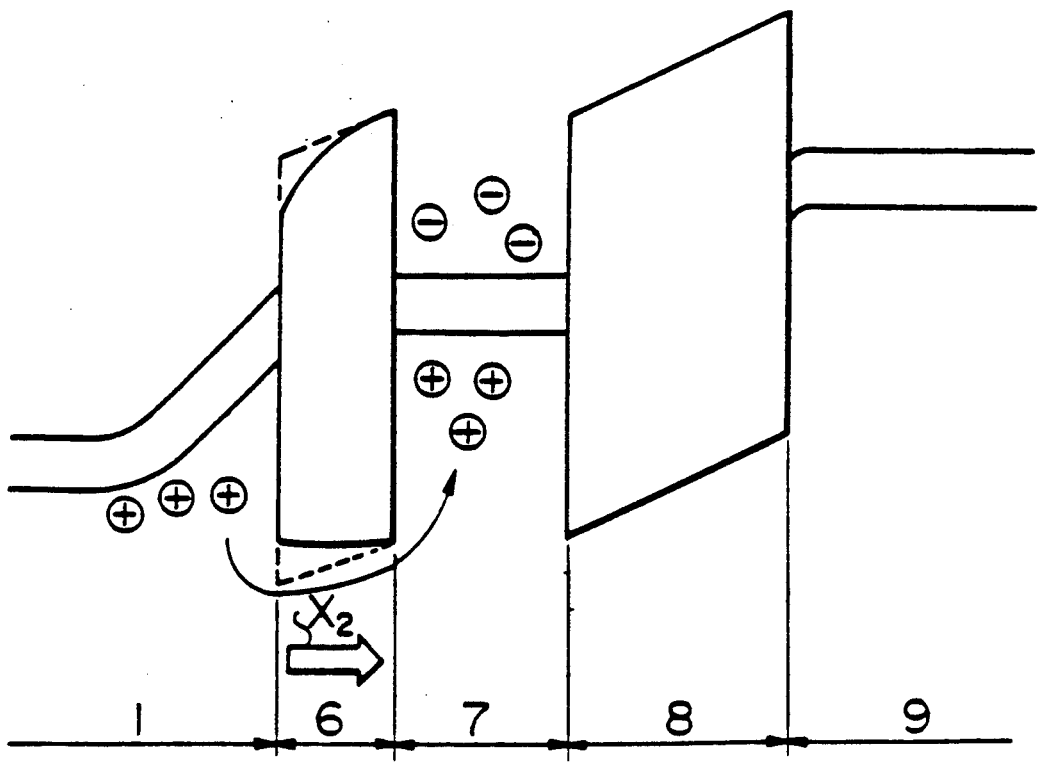

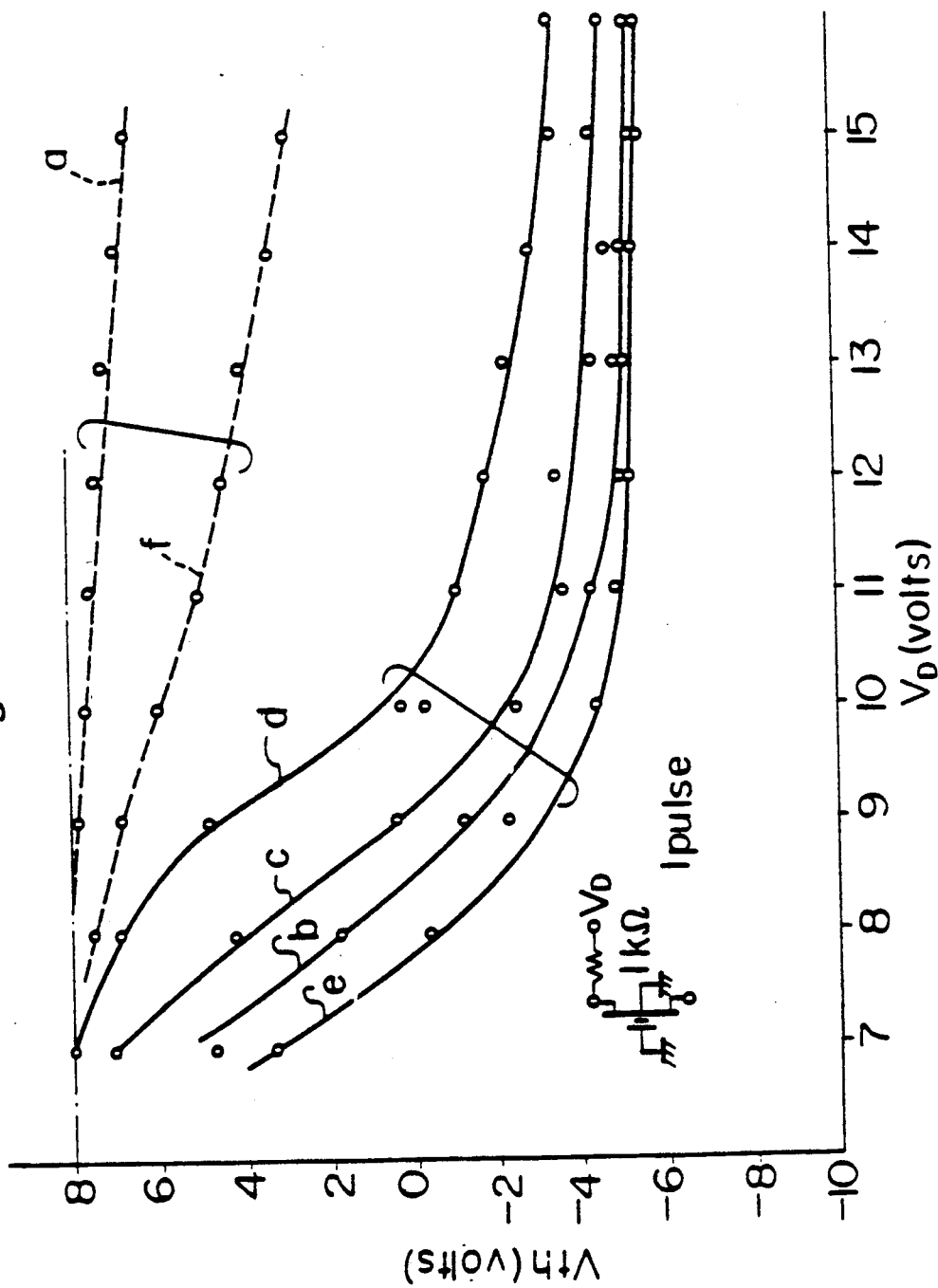

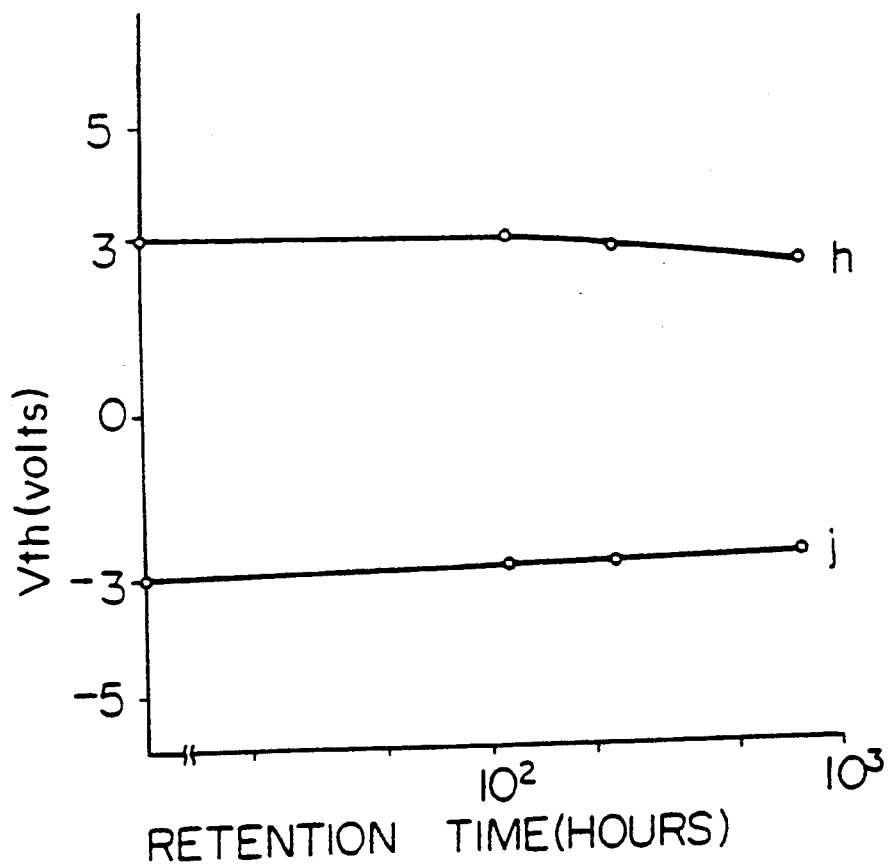

NONVOLATILE SEMICONDUCTOR MEMORY DEVICE

CROSS REFERENCE TO RELATED APPLICATIONS

This application is a continuation of U.S. application Ser. No. 541,107, filed Oct. 12, 1983, now abandoned, which is a continuation of U.S. application Ser. No. 182,672, filed Aug. 29, 1980, now abandoned.

BACKGROUND OF THE INVENTION

The present invention relates to a semiconductor device and, more particularly, to a nonvolatile semiconductor memory device of a charge-storage type.

In general, nonvolatile semiconductor memory devices of a charge-storage type are divided into two groups: floating-gate devices, such as the FAMOS (floating-gate avalanche-injection MOS, see: U.S. Pat. Nos. 3,660,819 and 3,984,822), and charge-trapping devices, such as the MNOS (metal silicon-nitride silicon-dioxide semiconductor) and the MAOS (metal alumina silicon-dioxide semiconductor).

In a floating-gate device, hot carriers generated due to avalanche breakdown are injected into a floating gate surrounded by an insulating material. On the other hand, in a charge-trapping device, carriers are injected into traps generated at the interface between two dissimilar insulating layers by using the tunnel effect. In these devices of an n-channel type, there are two states: a state in which electrons are accumulated in the floating-gate or in the traps so that a threshold voltage of the device is high, and a state in which electrons are driven out of the floating gate or the traps so that a threshold voltage of the device is low. In the devices of a p-channel type, there are also two states: a state in which holes are accumulated in the floating-gate or the traps, and a state in which holes are driven therefrom. The two different threshold voltages represent the two memory states "1" and "0".

In the conventional devices, in order to obtain long memory retentivity, i.e., good characteristics for storing information, the insulating layer between the substrate and the floating-gate (or the traps) is relatively thick, so that a special power supply at a high voltage is required to write information and erase it, in addition to the usual power supplies whose voltages are, for example, +12, +5 and −5 volts.

With the floating-gate devices, hot carriers, generated by avalanche breakdown which takes place in the vicinity of the drain junction, clear a potential barrier between the substrate and a first insulating layer and reach the floating gate. Therefore, if the potential barrier is diminished, a large number of hot carriers are injected into the floating-gate, which causes the control voltage to be decreased. At the same time, however, the potential barrier between the first insulating layer and the floating gate is also diminished, and accordingly a large number of the injected carriers are driven out of the floating gate through the first insulating layer to the substrate. This results in deterioration of the characteristics for storing information.

With the charge-trapping devices, the writing and erasing voltages can be decreased by reducing the thickness of a second insulating layer. However, when the thickness of the second insulating layer is reduced, the information storage characteristics are deteriorated and, in addition, undesired information is written during the read mode.

SUMMARY OF THE INVENTION

It is an object of the present invention to provide a nonvolatile semiconductor memory device which permits greatly reduced the writing and erasing voltages as compared with those of the conventional nonvolatile semiconductor memory device, without sacrificing the information storage characteristics.

According to the present invention, there is provided a nonvolatile semiconductor memory device comprising: a substrate of a first conductivity type; a first insulating layer disposed on the substrate, a second insulating layer disposed on the first insulating layer; and means for storing charges disposed between the first and second insulating layers, the energy band gap of the first insulating layer being gradually decreased between the charge storing means and the substrate.

BRIEF DESCRIPTION OF THE DRAWING

The present invention will be more clearly understood from the description as set forth below with reference with the accompanying drawings wherein:

FIGS. 3A, 3B and 3C are band diagrams showing the energy bands of a gate structure of the device of FIG. 1;

FIG. 4 is a diagram showing experimental plots of the drain voltage $V_D$ versus the threshold voltage $V_{th}$ of the device of FIG. 1;

FIGS. 5A and 5B are graphs showing the experimental retention characteristic of the device of FIG. 1, of the conventional device and the device according to the present invention, respectively;

DETAILED DESCRIPTION OF THE PREFERRED EMBODIMENTS

Figure 1:
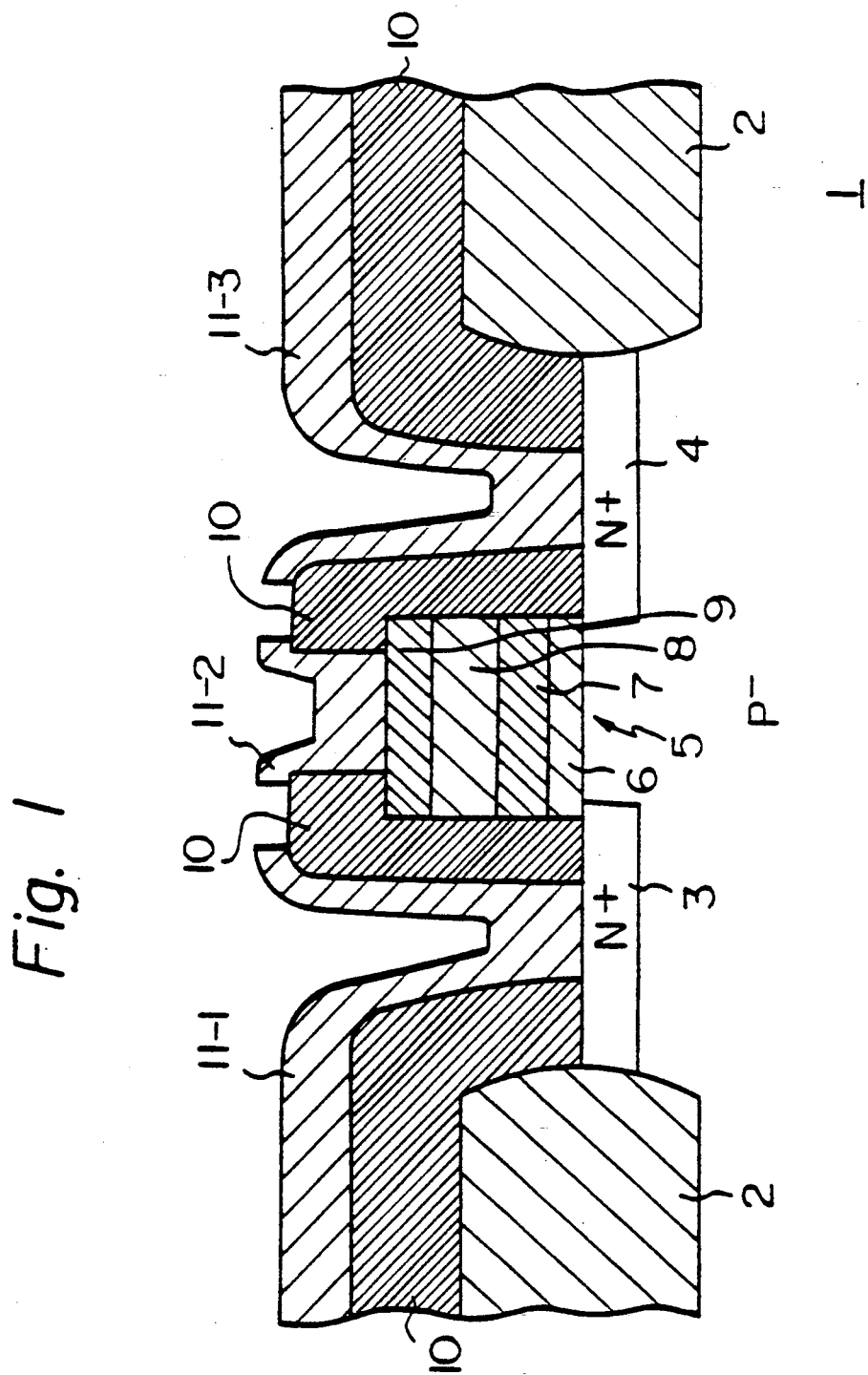
FIG. 1 is a cross-sectional view illustrating an embodiment of the floating-gate device according to the present invention.

In FIG. 1, which illustrates an embodiment of the floating-gate device according to the present invention, reference numeral 1 indicates a p-type silicon substrate having an impurity concentration of about $10^{15}$ to $10^{16}/cm^3$. A thick insulating layer 2 made of, for example, silicon dioxide is formed on the substrate 1 by a conventional thermal oxidation technology. The layer 2 is called a field insulating layer. In addition, a source region 3 and a drain region 4 having n-type impurities are formed in the substrate 1, and accordingly, a channel region 5 is formed therebetween. On the channel region 5, a first insulating layer 6, a floating-gate 7 made of, for example, polycrystalline silicon, a second insulating layer 8 made of, for example, silicon dioxide, and a control gate 9 made of, for example, polycrystalline silicon, are formed in order. Reference numeral 10 indicates an insulating layer made of, for example, phosphosilicate glass (PSG) for isolating connections 11-1, 11-2 and 11-3 made of, for example, aluminum. The connections 11-1 and 11-3 are connected to the source region 3 and the drain region 4, respectively, while the connection 11-2 is connected to the control gate 9.

The operation of the device of FIG. 1 will now be explained. The source region 3 is always grounded by the connection 11-1. When information is to be written or erased, a high positive voltage is applied through the connection 11-3 to the drain region 4, so that avalanche breakdown takes place in the p-n junction between the drain region 4 and the channel region 5. As a result, large numbers of hot electrons and hot holes are generated. In the write mode, a positive voltage is applied through the connection 11-2 to the control gate 9, so that hot electrons are injected from the region of avalanche breakdown into the floating-gate 7. Therefore, the threshold voltage of the device from the point of the control gate 9 is increased. In the erasing mode, a negative or zero voltage is applied through the connection 11-2 to the control gate 9, so that hot holes are injected from the region of avalanche breakdown into the floating gate 7. Therefore, the threshold voltage of the device from the control gate 9 is decreased. In the read mode, the voltage applied to the drain region 4 is low enough to cause no avalanche breakdown, and the on-state or off-state of the device can be read.

Figure 2A:
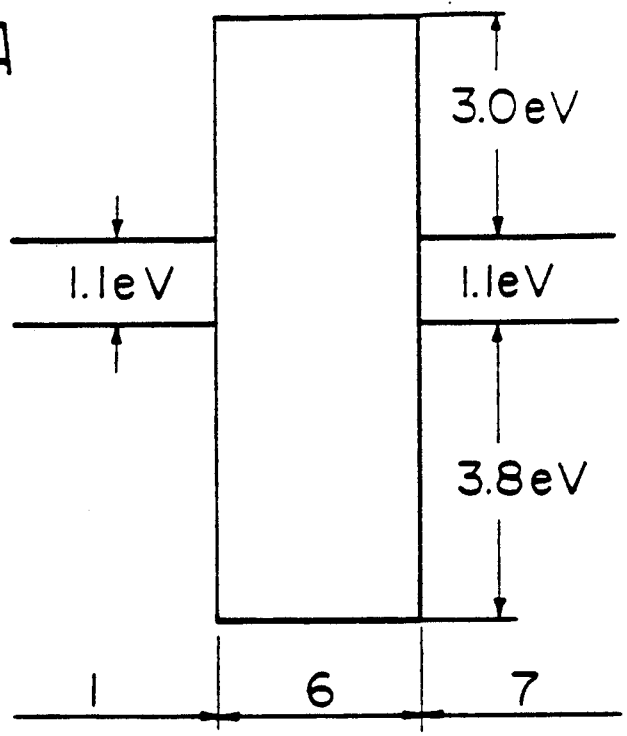
FIG. 2A is a band diagram showing the conventional energy band of the first insulating layer 6 of FIG. 1.

In the conventional device, the first insulating layer 6 is made of, for example, silicon dioxide. In this case, the energy band gap of the layer 6 is uniformly about 7.9 eV, as illustrated in FIG. 2A.

Figure 2B:
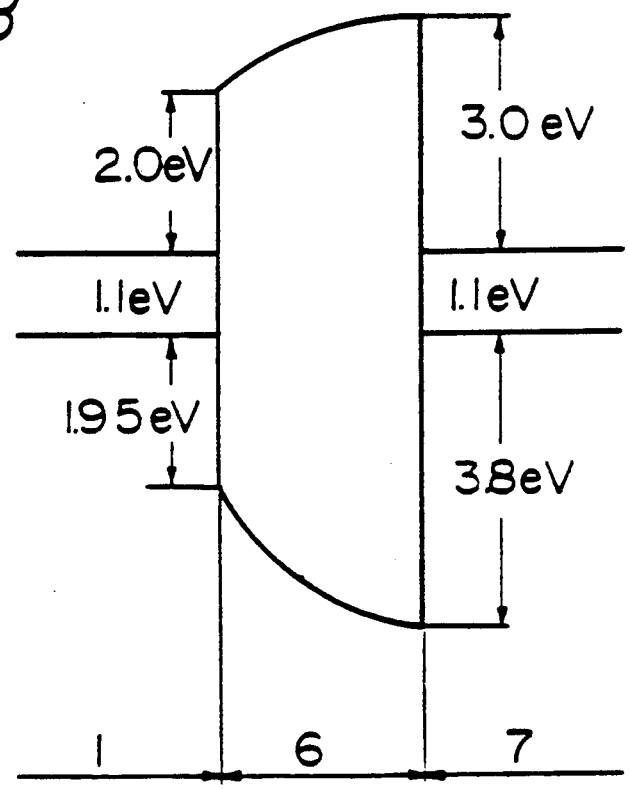
FIG. 2B and 2C are band diagrams showing the energy band of the first insulating layer 6 of FIG. 1 according to the present invention.

Contrary to above, in the first insulating layer 6 according to the present invention, the energy band gap thereof is graded, that is, the energy band gap is gradually increased between the substrate 1 and the floating gate 7, as illustrated in FIG. 2B. For example, the first insulating layer 6 is obtained by oxidizing the surface of silicon nitride. That is, a thermally grown silicon nitride layer or a silicon nitride layer produced by chemical vapor deposition (CVD), of 50 Å thickness, is made on the substrate 1 and, after that, the thermally grown silicon nitride is oxidized by using a thermal oxidation technology. Thus, a thermally oxidized layer produced from silicon nitride, which is 100 Å in thickness is obtained. In this case, the energy band gap at the portion of the substrate 1 is about 5 eV, which is the same as that of silicon nitride, while the energy band gap at the floating-gate 7 is about 7.9 eV, which is the same as that of silicon dioxide as illustrated in FIG. 2B.

Figure 2C:
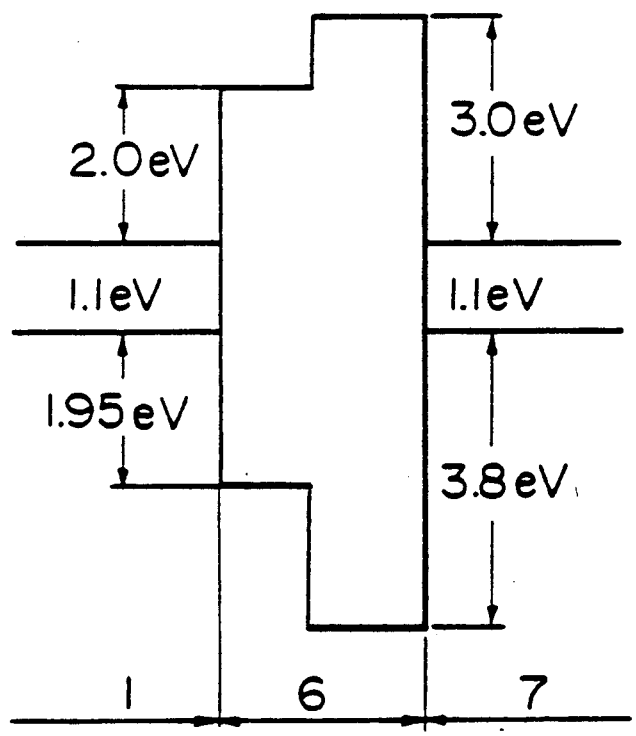

In addition, the first insulating layer 6 according to the present invention may also comprise two distinct insulating layers, such as silicon nitride and silicon dioxide. In this case, the energy band gap is also about 5 eV at the portion of the substrate 1 and about 7.9 eV at the portion of the floating gate 7, as illustrated in FIG. 2C.

The above-mentioned first insulating layer 6 according to the present invention permits a lower voltage to be applied to the control gate 9 than in the conventional devices, without sacrificing at the same time, secures the information storage characteristics. The first insulating layer 6 will now be explained in detail.

FIG. 3A is a band diagram showing the energy bands of a gate structure of the device of FIG. 1 the writing mode, i.e., in the case of injecting hot electrons into the floating-gate 7. In this case, since a positive voltage is applied to the control gate 9, an accelerating electric field, indicated by an arrow $X_1$, is applied to the hot electrons. As a result, the height of an the potential barrier against the hot electrons is reduced as compared with the conventional devices, indicated by a dotted line, and accordingly, a larger quantity of hot electrons (whose energies are distributed according to Maxwell-Boltzmann's law) is injected into the floating-gate 7. Therefore, the positive voltage applied to the control gate 9 can be reduced as compared with the conventional devices. It should be noted that the potential barrier heights surrounding the floating gate are almost the same as in the conventional FAMOS devices. Therefore, the electrons injected into the floating-gate 7 may not be driven from the floating-gate 7.

FIG. 3B is a band diagram showing the energy bands of a gate structure of the device of FIG. 1 in the erasing mode, i.e., in the case of injecting hot holes into the floating-gate 7. In this case, since a negative voltage or zero voltage is applied to the control gate 9, an accelerating electric field, indicated by an arrow $X_2$, is applied to the hot holes. As a result, the height of the potential barrier against the hot holes is reduced as compared with the conventional devices, indicated by a dotted line, and accordingly, a larger quantity of hot holes is injected into the floating-gate 7. Therefore, the negative voltage applied to the control gate 9 and the positive voltage to the drain 4 can be reduced as compared with the conventional devices. It should be noted that the potential barrier heights surrounding the floating gate are almost the same as the conventional FAMOS devices. Therefore, the holes injected into the floating-gate 7 may not be driven from the floating-gate 7.

Figure 3C:
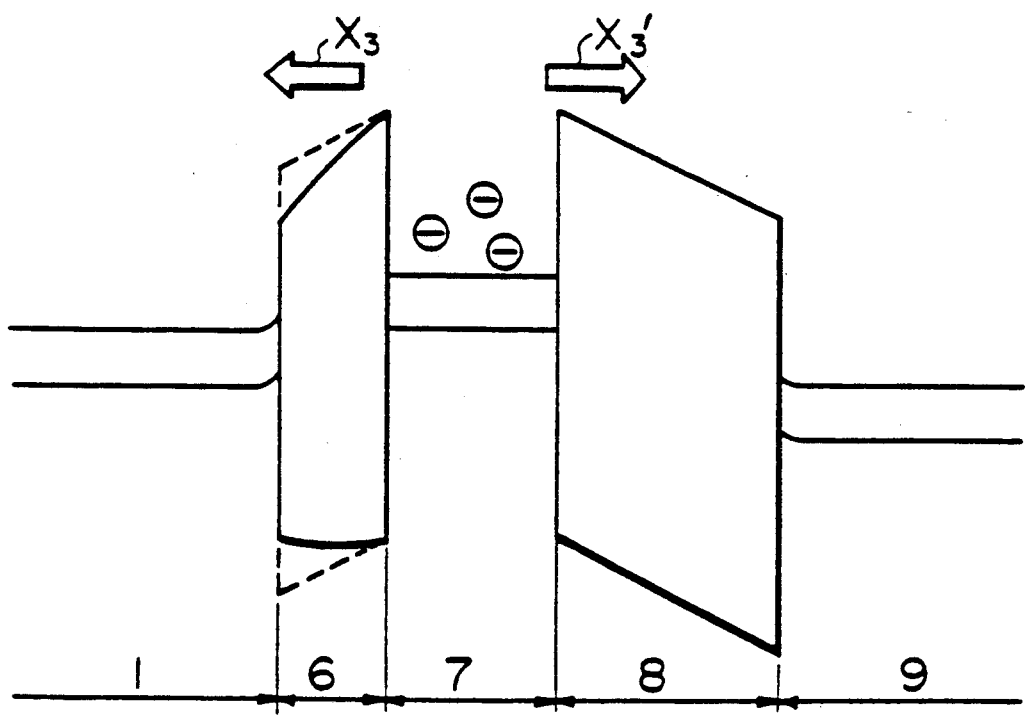

FIG. 3C is a further band diagram showing the energy bands of a gate structure of the device of FIG. 1, during retention of the memory state. In this case, electric fields indicated by arrows $X_3$ and $X_3'$ are applied to the injected electrons. However, the height of the potential barrier against the electrons according to the present invention is the same as that in the conventional FAMOS devices as indicated by a dotted line. Therefore, the characteristics for storing information are secured.

FIG. 4 is a diagram showing experimental plots of the drain voltage $V_D$ versus the threshold voltage $V_{th}$ of the device of FIG. 1. In FIG. 4, the drain voltage $V_D$ is indicated by the abscissa, while the threshold voltage $V_{th}$ is indicated by the ordinate. Dotted curves a and f indicate experimental results of the conventional devices, wherein the first insulating layer 6 is comprised of a silicon dioxide of 100 Å in thickness. Solid curves b, c, d and e indicate experimental results according to the present invention, wherein the first insulating layer 6 is obtained by thermally oxidizing the surface of silicon nitride which is also thermally grown. The thickness of the thermally oxidized silicon nitride is 100 Å. In addition, the pulse width of the voltage $V_D$ is 100 msec in the curves a and b, 10 msec in the curve c, 1 msec in the curve d, and 1 sec in the curves e and f.

As illustrated in FIG. 4, according to the present invention, a larger threshold voltage shift is obtained at a low drain voltage $V_D$, in other words, hot holes can be injected into the floating-gate 7 by using a low voltage supply.

Figure 5A:
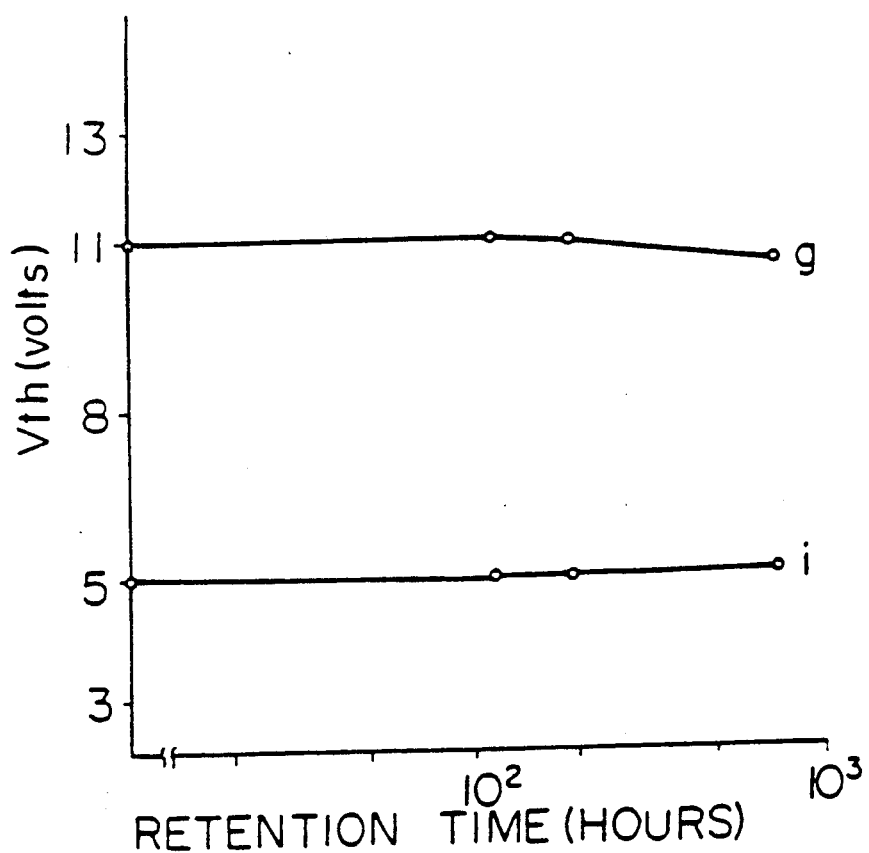

FIGS. 5A and 5B are graphs showing the experimental retention characteristic of the conventional device and the device of the present invention, respectively. The experiments were carried out at a temperature of 150° C. In FIGS. 5A and 5B, the curves g and h indicate the cases of electron injections, while the curves i and j indicate the cases of hole injections. As can be understood from FIGS. 5A and 5B, the retention characteristics i.e., the information storage characteristics, are almost the same.

In the above-mentioned embodiment, the present invention is applicable to a floating-gate device having a control gate 9. However, it goes without saying that the present invention can be applicable to a floating-gate device having no control gate.

Figure 6:
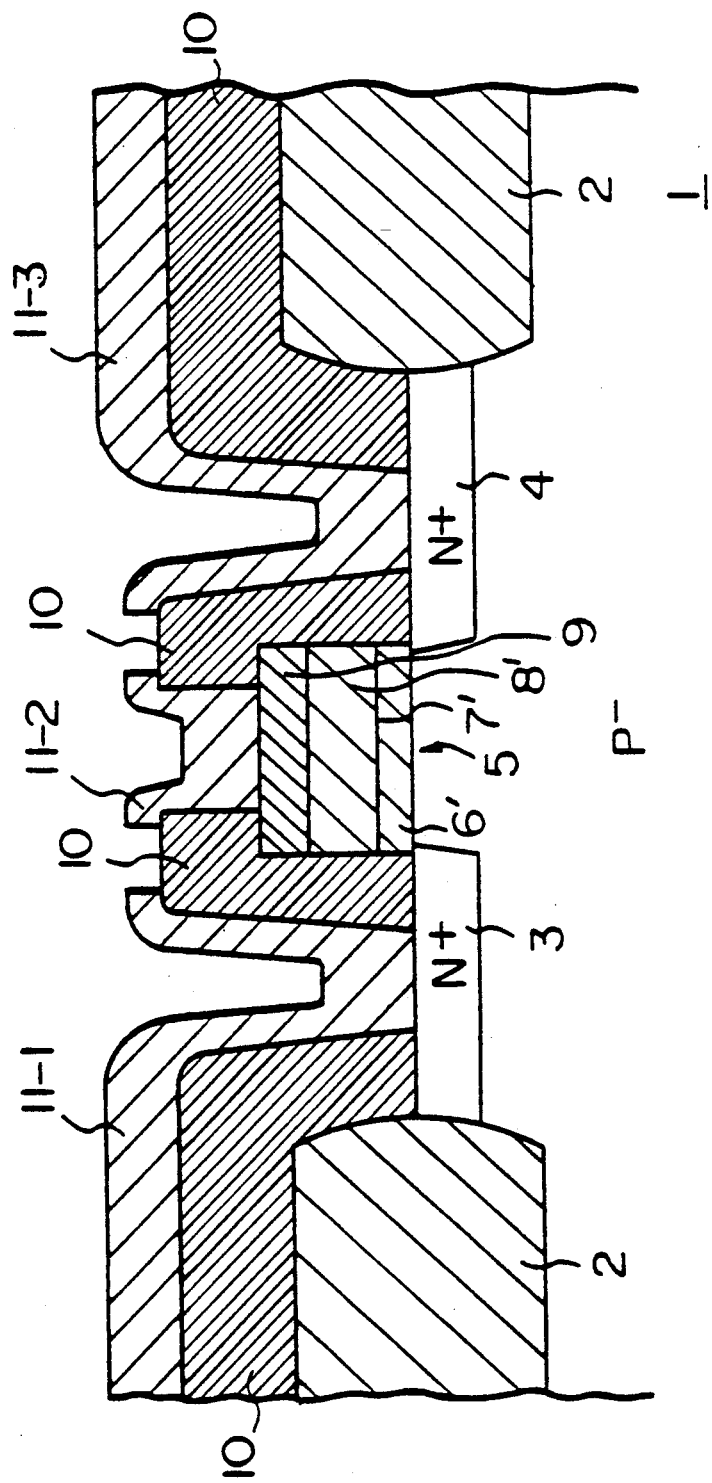
FIG. 6 is a cross-sectional view illustrating an embodiment of the charge-trapping device according to the present invention and FIGS. 7A, 7B and 7C are band diagrams showing the energy bands of a gate structure of the device of FIG. 6.

FIG. 6 is a cross-sectional view illustrating an embodiment of the charge trapping device according to the present invention. The elements in FIG. 6 which are identical to those of FIG. 1 are denoted by the same characters reference. In FIG. 6, two dissimilar insulating layers 6' and 8' are positioned in contact with each other. Therefore, traps 7' for trapping electrons are formed at the interface between the insulating layers 6' and 8'. The traps 7' serve the same purpose as the floating-gate 7 of FIG. 1.

In FIG. 6, in the write mode, when a high positive voltage is applied to the control gate 9, electrons tunnel from the substrate 1 to the traps 7', so that the threshold voltage of the device of FIG. 6 from the point of the control gate 9 is increased. In the erasing mode, when a high negative voltage is applied to the control gate 9, holes tunnel from the substrate 1 to the traps 7.

The first insulating layer 6' of the device of FIG. 6 is manufactured in the same way as the first insulating layer 6 of FIG. 1.

Figure 7A:
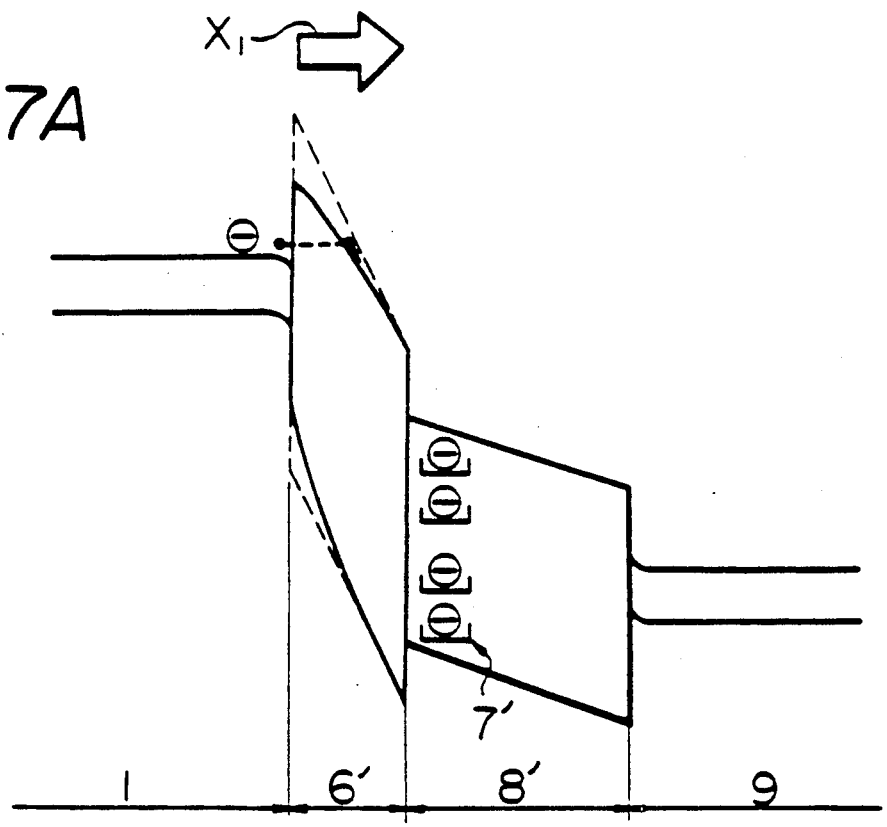
Figure 7B:
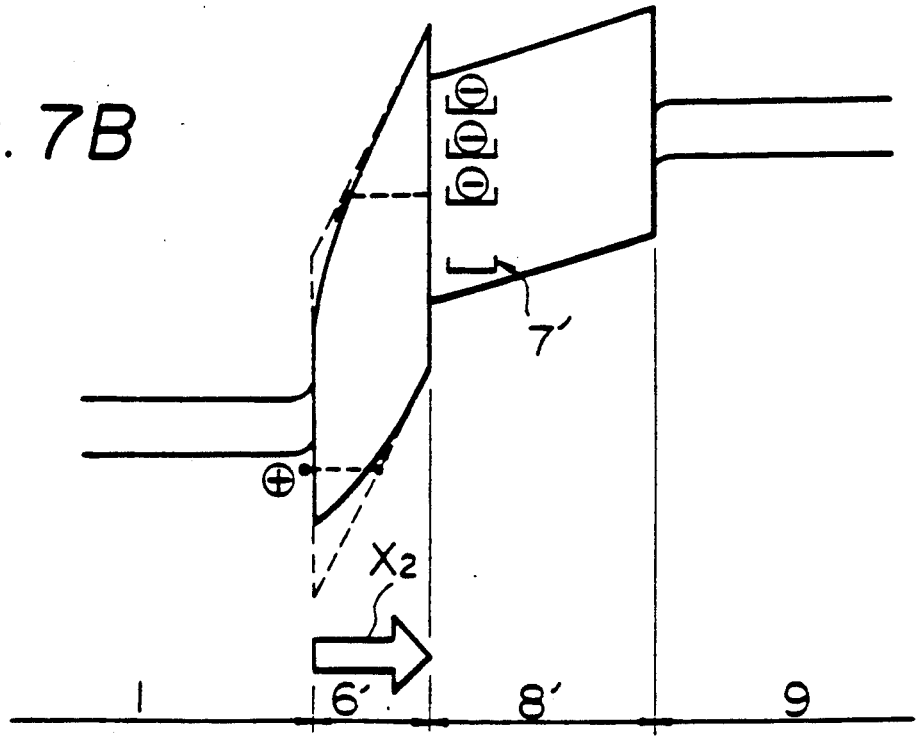
Figure 7C:
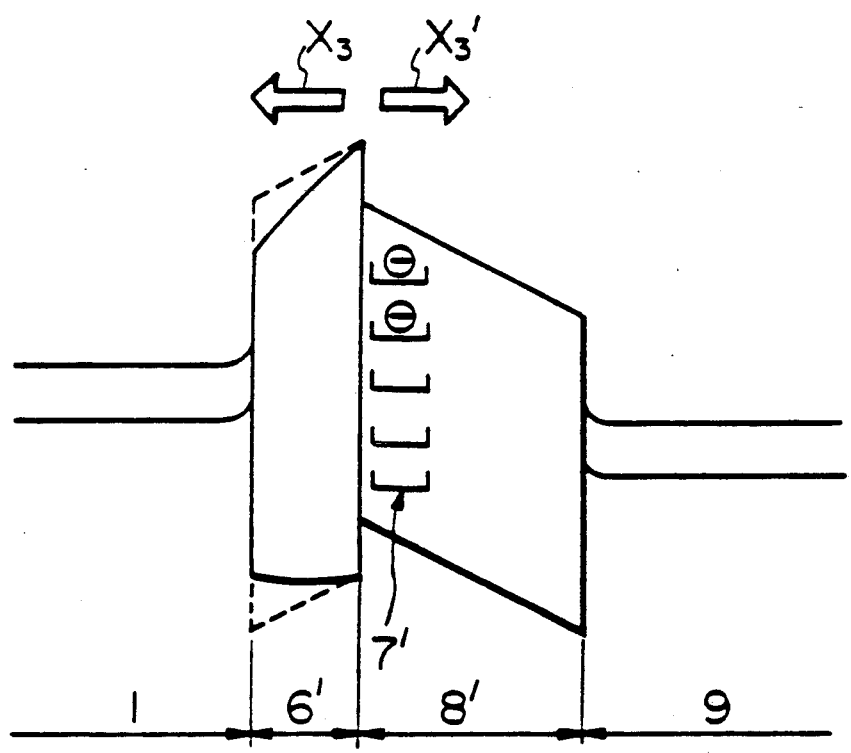

FIGS. 7A, 7B and 7C are band diagrams showing the energy bands of a gate structure of the device of FIG. 6. FIGS. 7A, 7B and 7C are analogous to FIGS. 3A, 3B and 3C, respectively. That is, in FIG. 7A, a positive voltage is applied to the control gate 9, so that an accelerating electric field indicated by an arrow $X_1$ is applied to electrons in the substrate 1. As a result, the tunneling distance of the electrons is reduced as compared with the conventional devices (indicated by a dotted line). However, the height of the potential barrier against the electrons injected into the traps 7' is almost the same as the conventional devices.

In FIG. 7B, a negative voltage is applied to the control gate 9, so that an accelerating electric field, indicated by an arrow $X_2$, is applied to the electrons in the traps 7'. As a result, the tunneling distance of electrons is reduced as compared with the conventional devices (indicated by a dotted line).

In FIG. 7C, electric fields, indicated by arrows $X_3$ and $X_3'$, are applied to the electrons in the traps 7'. However, the height of the potential barrier against the electrons according to the present invention is the same as that of the conventional devices.

In the above-mentioned embodiment of FIG. 6, interfacial traps are provided so that carriers tunnel between the interfacial traps and the substrate. However, a floating-gate can be also provided instead of such interfacial traps. In a device having such a floating gate, wherein carriers tunnel between the floating-gate and the substrate, the writing and the erasing voltages can be also decreased.

As explained hereinbefore, the nonvolatile semiconductor device, such as the floating-gate device or the charge-trapping device, according to the present invention, has an advantage, as compared with the conventional devices, in that the writing and erasing voltages are low. This is because, the first insulating layer disposed between the substrate and the floating-gate (or the traps) has an energy band gap which is gradually increased between the substrate and the floating-gate (or the traps).

A graded band-gap insulator which is partially similar to that of the present invention may be obtained by thermally oxidizing a silicon substrate, since the concentration of silicon in the insulator is high near the substrate so that the band-gap thereof becomes narrow. In this case, however, the thickness of the portion of the insulator having graded band-gaps is so small that the writing and erasing voltages cannot be decreased.

What is claimed is:

1. A nonvolatile semiconductor memory device comprising:
   a semiconductor substrate of a first conductivity type;
   a first insulating layer disposed on said semiconductor substrate, said first insulating layer being in direct contact with said semiconductor substrate, said first insulating layer comprising direct-thermally grown oxidized silicon nitride having a thickness which is substantially 100 Å and having a graded composition in the direction of its thickness;
   a second insulating layer disposed on said first insulating layer; and
   means for storing charges disposed between said first and second insulating layers.

2. A device as set forth in claim 1, wherein said charge storing means comprises a floating-gate.

3. A device as set forth in claim 1, wherein the materials of said first and second insulating layers are different from each other, and wherein said charge storing means comprises traps at the interface of said first and second insulating layers.

4. A device as set forth in claim 1, wherein said second insulating layer is made of silicon dioxide.

5. A device as set forth in claim 1, further comprising a control gate disposed on said second insulating layer.

6. A device as set forth in claim 2 further comprising a pair of source and drain regions of a second conductivity type opposite to said first conductivity type formed in said substrate apart from each other, and a channel region disposed between said source and drain regions in said substrate, said first insulating layer being disposed above said channel region.

7. A device as set forth in claim 6, wherein a writing operation is performed by causing avalanche breakdown in the vicinity of said drain region and injecting hot carriers of a first polarity into said floating-gate, and an erasing operation is performed by causing avalanche breakdown and injecting hot carriers of a second polarity opposite to said first polarity into said floating-gate.

8. A device as set forth in claim 6, wherein a writing operation is performed by tunneling carriers of a first polarity from said substrate through said first insulating layer to said floating-gate, and an erasing operation is performed by tunneling carriers of said first polarity from said floating-gate through said first insulating layer to said substrate.

9. A device as set forth in claim 6, wherein a writing operation is performed by tunneling carriers of a first polarity from said substrate through said first insulating layer to said traps, and an erasing operation is performed by tunneling carriers of said first polarity from said traps through said first insulating layer to said substrate.

10. A device as set forth in claim 3 further comprising a pair of source and drain regions of a second conductivity type opposite to said first conductivity type formed in said substrate apart from each other, and a channel region disposed between said source and drain regions in said substrate, said first insulating layer being disposed above said channel region.

11. A device as set forth in claim 10, wherein a writing operation is performed by causing avalanche breakdown in the vicinity of said drain region and injecting hot carriers of a first polarity into said floating-gate, and an erasing operation is performed by causing avalanche breakdown and injecting hot carriers of a second polarity opposite to said first polarity into said floating-gate.

12. A device as set forth in claim 10, wherein a writing operation is performed by tunneling carriers of a first polarity from said substrate through said first insulating layer to said floating-gate, and an erasing operation is performed by tunneling carriers of said first polarity from said floating-gate through said first insulating layer to said substrate.

13. A device as set forth in claim 10, wherein a writing operation is performed by tunneling carriers of a first polarity from said substrate through said first insulating layer to said traps, and an erasing operation is performed by tunneling carriers of said first polarity from said traps through said first insulating layer to said substrate.

* * * * *

UNITED STATES PATENT AND TRADEMARK OFFICE
CERTIFICATE OF CORRECTION

PATENT NO. : 5,101,249
DATED : MARCH 31, 1992
INVENTOR(S) : SHINPEI HIJIYA ET AL.

It is certified that error appears in the above-identified patent and that said Letters Patent is hereby corrected as shown below:

Col. 2, line 44, "invention and" should be --invention; and--.

Col. 3, line 61, "FIG. 1 the" should be --FIG. 1 in the--;
line 66, "an" should be deleted.

Col. 5, line 12, "characters reference." should be --reference characters.--.

Col. 6, line 36, "2" should be --2,--;
line 64, "3" should be --3,--.

Signed and Sealed this

Seventeenth Day of August, 1993

Attest:

BRUCE LEHMAN

Attesting Officer    Commissioner of Patents and Trademarks